(12) United States Patent
Matsuyama et al.

(10) Patent No.: US 6,979,474 B2
(45) Date of Patent: Dec. 27, 2005

(54) HEAT TREATMENT METHOD, HEAT TREATMENT APPARATUS AND TREATMENT SYSTEM

(75) Inventors: Yuji Matsuyama, Kikuchi-gun (JP); Yoji Mizutani, Kawasaki (JP); Shinji Nagashima, Kikuchi-gun (JP); Akira Yonemizu, Kumamoto (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/886,213

(22) Filed: Jun. 22, 2001

(65) Prior Publication Data

US 2001/0029890 A1 Oct. 18, 2001

Related U.S. Application Data

(62) Division of application No. 09/272,782, filed on Mar. 19, 1999, now Pat. No. 6,261,365.

(30) Foreign Application Priority Data

Mar. 20, 1998 (JP) .......................................... 10-092494
Oct. 28, 1998 (JP) .......................................... 10-322884

(51) Int. Cl.$^7$ ................................................ B05D 3/00
(52) U.S. Cl. .................... 427/240; 427/374.1; 427/377; 427/385.5; 118/52; 438/758; 438/780

(58) Field of Search .............................. 427/377, 385.5, 427/240, 374.1; 438/758, 780

(56) References Cited

U.S. PATENT DOCUMENTS

| | | | | |
|---|---|---|---|---|
| 4,590,101 A | * | 5/1986 | Knapczyk | 427/350 |
| 4,839,232 A | * | 6/1989 | Morita et al. | 428/473.5 |
| 5,252,807 A | * | 10/1993 | Chizinsky | 219/390 |
| 5,380,567 A | * | 1/1995 | Haluska | 427/578 |
| 5,658,387 A | * | 8/1997 | Reardon et al. | 118/323 |
| 5,885,353 A | * | 3/1999 | Strodtbeck et al. | 118/712 |
| 6,066,574 A | * | 5/2000 | You et al. | 438/781 |
| 6,090,212 A | * | 7/2000 | Mahawili | 118/728 |
| 6,423,651 B1 | * | 7/2002 | Nakano et al. | 438/782 |

* cited by examiner

*Primary Examiner*—Kirsten Jolley
(74) *Attorney, Agent, or Firm*—Oblon, Spivak, McClelland, Maier & Neustadt, P.C.

(57) ABSTRACT

When a substrate coated with a coating solution which oxidizes at high temperatures is heat-treated, an oxygen concentration of a treatment atmosphere is lowered when the temperature is low. Next, the substrate is heat-treated in the treatment atmosphere of which the oxygen concentration is lowered. Sequentially, the treatment atmosphere is returned to that with the original oxygen concentration after the passage of a predetermined time after completing the heat treatment. Thereby, the substrate can be heat-treated, with the oxidization of the coating solution being controlled.

15 Claims, 15 Drawing Sheets

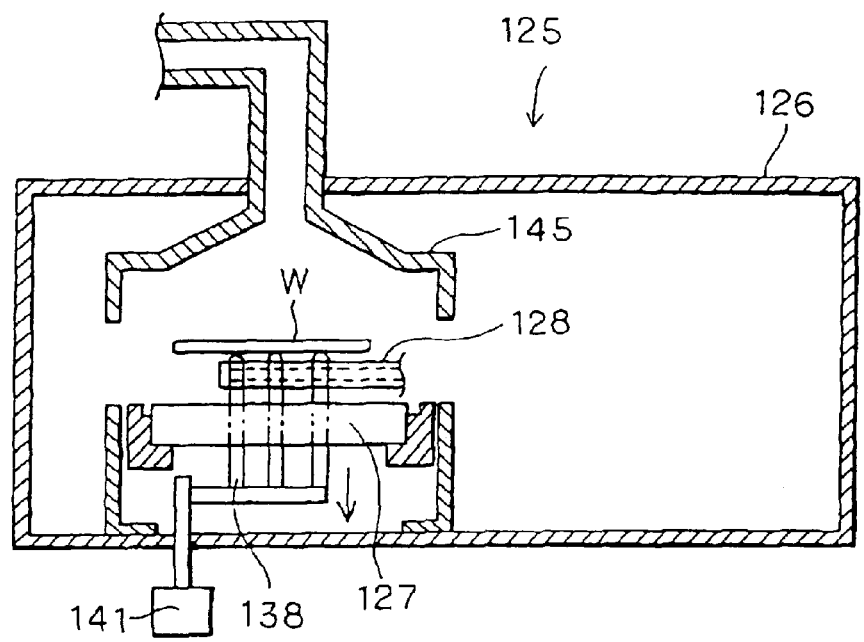
F I G. 1 8
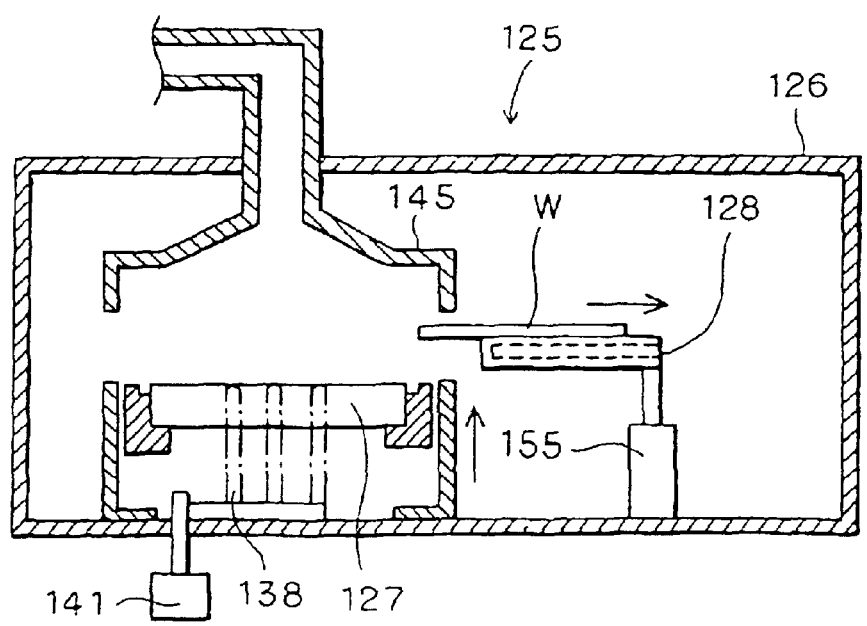
F I G. 1 9

HEAT TREATMENT METHOD, HEAT TREATMENT APPARATUS AND TREATMENT SYSTEM

This application is a division of application Ser. No. 09/272,782 filed on Mar. 19, 1999, which issued as U.S. Pat. No. 6,261,365.

BACKGROUND OF THE INVENTION

1. Field of the Invention

The present invention relates to a heat treatment method, a heat treatment apparatus and a treatment system useful, for example, for forming an SOD (Spin On Dielectric) film on a semiconductor wafer or for photo-resist treatment in a process of semiconductor device fabrication.

2. Description of the Related Art

When forming an organic SOD film such as plastic on a semiconductor wafer (referred to as "a wafer" hereinafter), the process is generally carried out as described below.

First, while the wafer mounted on a spin chuck is rotated, a coating solution is supplied onto a rotational center of the wafer. Thereby, the supplied coating solution is spread out on the whole surface of the wafer by centrifugal force. Next, the wafer coated with the coating solution is heat-treated, for example, at about 400° C. in an oven. Thereafter, the wafer is carried to a cooling treatment apparatus by a carrying apparatus to be cooled by the cooling treatment apparatus.

SUMMARY OF THE INVENTION

However, when the coating solution is organic such as plastic, there is a disadvantage that the heat treatment at high temperatures as described above causes the coating solution on the substrate to oxidize.

Furthermore, the heat-treated wafer is gradually cooled while carried by the carrying apparatus, there is a possibility that the heat treatment still proceeds, resulting in that the heat treatment is excessively performed.

An object of the present invention is to provide a heat treatment method, a heat treatment apparatus and a treatment system capable of heat-treating a substrate, controlling the oxidization of a coating solution.

Another object of the present invention is to provide a heat treatment method, a heat treatment apparatus and a treatment system capable of instantly starting cooling treatment of the heat-treated substrate.

Still another object of the present invention is to provide a heat treatment method, a heat treatment apparatus and a treatment system in which a fine adjustment for performing an appropriate cooling is easy and also the mechanism is simple.

To attain the above objects, the first aspect of the present invention, in a method to heat-treat a substrate, includes the processes of: (a) controlling a gas concentration of an atmosphere in which heat treatment is carried out; and (b) heat-treating the substrate in the atmosphere of which the gas concentration is controlled.

The second aspect of the present invention, in a method to heat-treat a substrate coated with a coating solution which oxidizes at high temperatures, includes the processes of: (a) lowering an oxygen concentration of a treatment atmosphere when the temperature is low; (b) heat-treating the substrate in the treatment atmosphere of which the oxygen concentration is lowered; and (c) returning the treatment atmosphere to that with the original oxygen concentration after completing the heat treatment.

The third aspect of the present invention, in a heat treatment apparatus, includes: a treatment chamber; a holding member provided in the treatment chamber for holding the substrate coated with an organic coating solution; a means for replacing an atmosphere in the treatment chamber with inert gas; a means for heat-treating the substrate held by the holding member in the atmosphere which is replaced with the inert gas by the replacing means; and a means for exposing the inside of the treatment chamber to the air after the passage of a predetermined time from the completion of the heat treatment.

The fourth aspect of the present invention, in a heat treatment apparatus, includes: a treatment chamber; a holding member provided in the treatment chamber for holding the substrate coated with an organic coating solution; a means for replacing an atmosphere in the treatment chamber with inert gas; a means for heat-treating the substrate held by the holding member in the atmosphere which is replaced with the inert gas by the replacing means; a means for measuring the temperature of the substrate to be heat-treated; and a means for exposing the inside of the treatment chamber to the air when the temperature of the substrate becomes lower than a predetermined value after completing the heat treatment.

The fifth aspect of the present invention, in a treatment system, includes: a treatment chamber; a holding member provided in the treatment chamber for holding the substrate coated with an organic coating solution; a means for replacing an atmosphere in the treatment chamber with inert gas; a means for heat-treating the substrate held by the holding member in the atmosphere which is replaced with the inert gas by the replacing means; a means for exposing the inside of the treatment chamber to the air after the passage of a predetermined time from the completion of the heat treatment; and a carrying apparatus disposed in the treatment chamber for carrying the substrate in/out, and in which the carrying apparatus includes: a holding and cooling plate for holding and cooling the substrate; and adjusting and supporting pins disposed adjustably in height on the holding and cooling plate for supporting the substrate to be apart from the holding and cooling plate.

In the present invention, when a substrate coated with a coating solution which oxidizes at high temperatures is heat-treated, a gas concentration such as an oxygen concentration or the like of an atmosphere in which heat treatment is performed is controlled so that, for example, the treatment atmosphere is replaced with inert gas. Therefore, the substrate can be heat-treated, with the oxidization of the coating solution being controlled.

In a state that the substrate is supported by support pins and apart from a surface of the holding and heating member, the atmosphere in the treatment chamber is replaced with the inert gas. The support pins withdraw, thereby the substrate abuts on the surface of the holding and heating member to be heat-treated. After completing the heat treatment, the substrate is separated from the surface of the holding and heating member by projecting the support pins. Further, after the passage of a predetermined time or when the temperature of the substrate is lowered than a predetermined value, a lid body is opened to expose the inside of the treatment chamber to the air. The above structure easily enables replacement with inert gas, heat treatment after the replacement, and cooling after the heat treatment. If replacement with inert gas and heat treatment after the replacement are intended to be realized by controlling the temperature of the holding and heating member, temperature-controlling is difficult and especially it is difficult that the temperature is returned to the original value (e. g., room temperature) to perform the next replacement after heating.

Moreover, in the treatment system of the present invention, adjusting and supporting pins which are placed on the holding and cooling plate of the carrying apparatus can be adjusted in height, therefore a very simple structure enables a fine adjustment to be easily performed for an appropriate cooling.

The sixth aspect of the present invention, in a treatment system, includes: a casing; a heating and mounting table provided in the casing for heating the mounted substrate to a predetermined temperature; a hoisting and lowering member provided at the heating and mounting table and vertically movable with holding the substrate; and a cooling and mounting table provided in the casing and capable of receiving the substrate which is supported by the hoisting and lowering member for cooling the received substrate to a predetermined temperature.

According to the present invention, it is unnecessary to include a process of carrying the substrate from the heating and mounting table to the cooling and mounting table by an extra-provided carrying means, and cooling treatment can be performed by the cooling and mounting table immediately after receiving the heat-treated substrate. Consequently, an exceed heat treatment can be prevented, a pattern is not deformed, and an yield rate can be improved.

These objects and the other objects and advantages of the present invention can be easily confirmed with the following description and the accompanying drawings.

BRIEF DESCRIPTION OF THE DRAWINGS

FIG. 18 is an explanatory view showing a manner that the cooling and mounting table in FIG. 17 receives a wafer supported by hoisting and lowering pins;

FIG. 19 is an explanatory view showing a manner that the cooling and mounting table which has received a wafer recedes from a heating and mounting table;

DETAILED DESCRIPTION OF THE PREFERRED EMBODIMENT

Hereinafter, embodiments of the present invention will be described with reference to the accompanying drawings.

Figure 1:
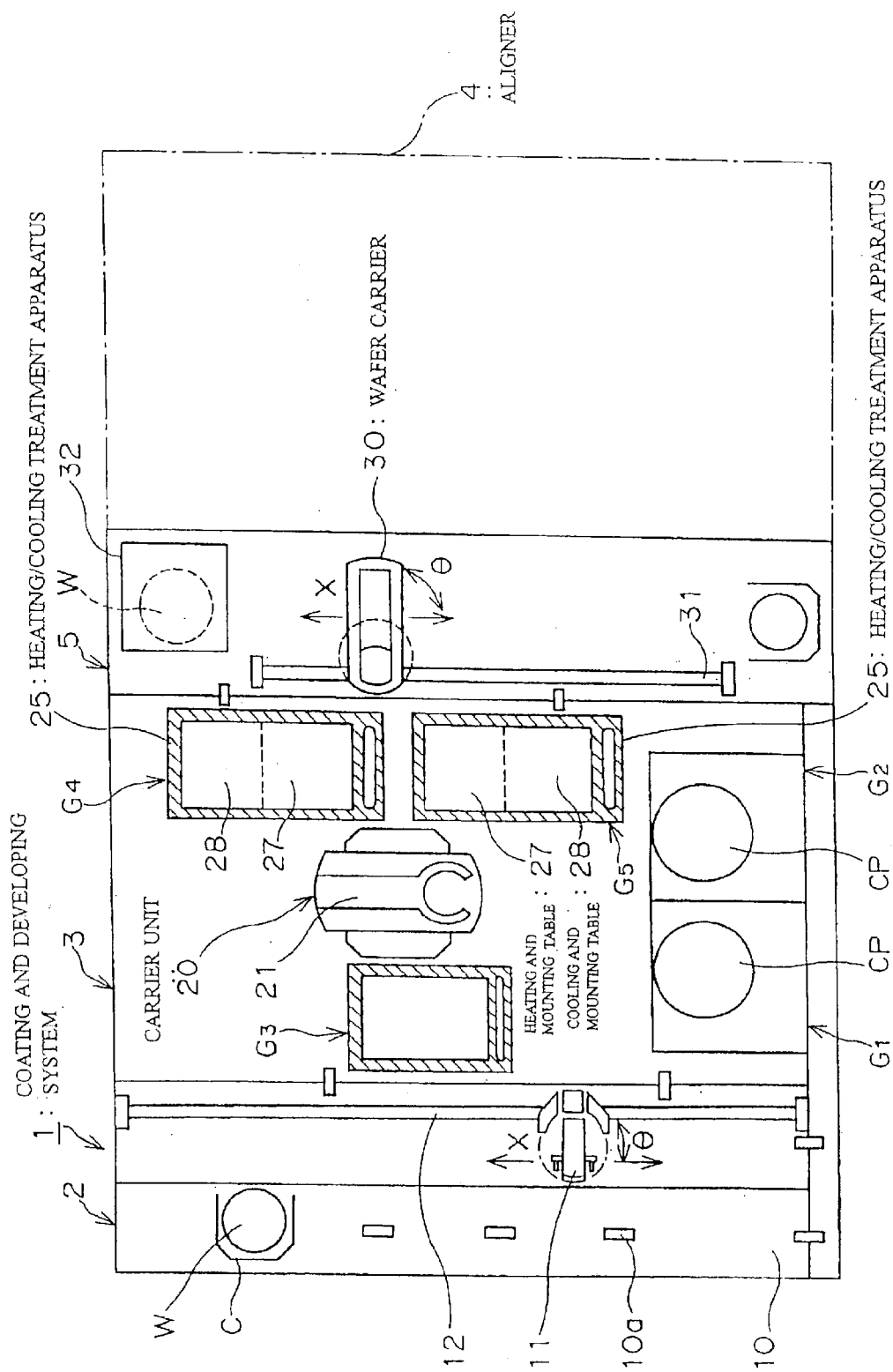
FIG. 1 is a plane view of a film-forming system according to an embodiment of the present invention.
Figure 2:
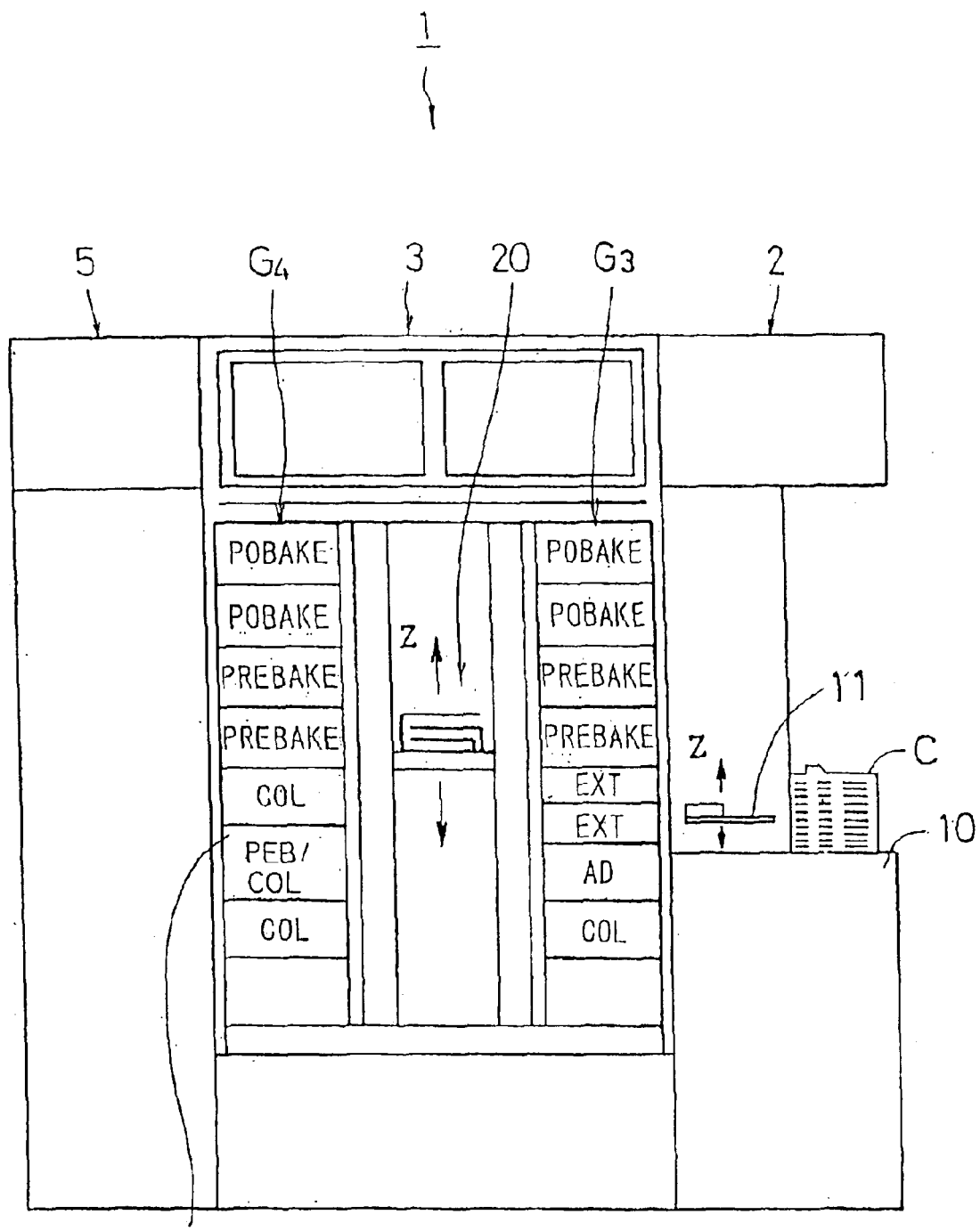
FIG. 2 is a front view of the film-forming system shown in FIG. 1.
Figure 3:
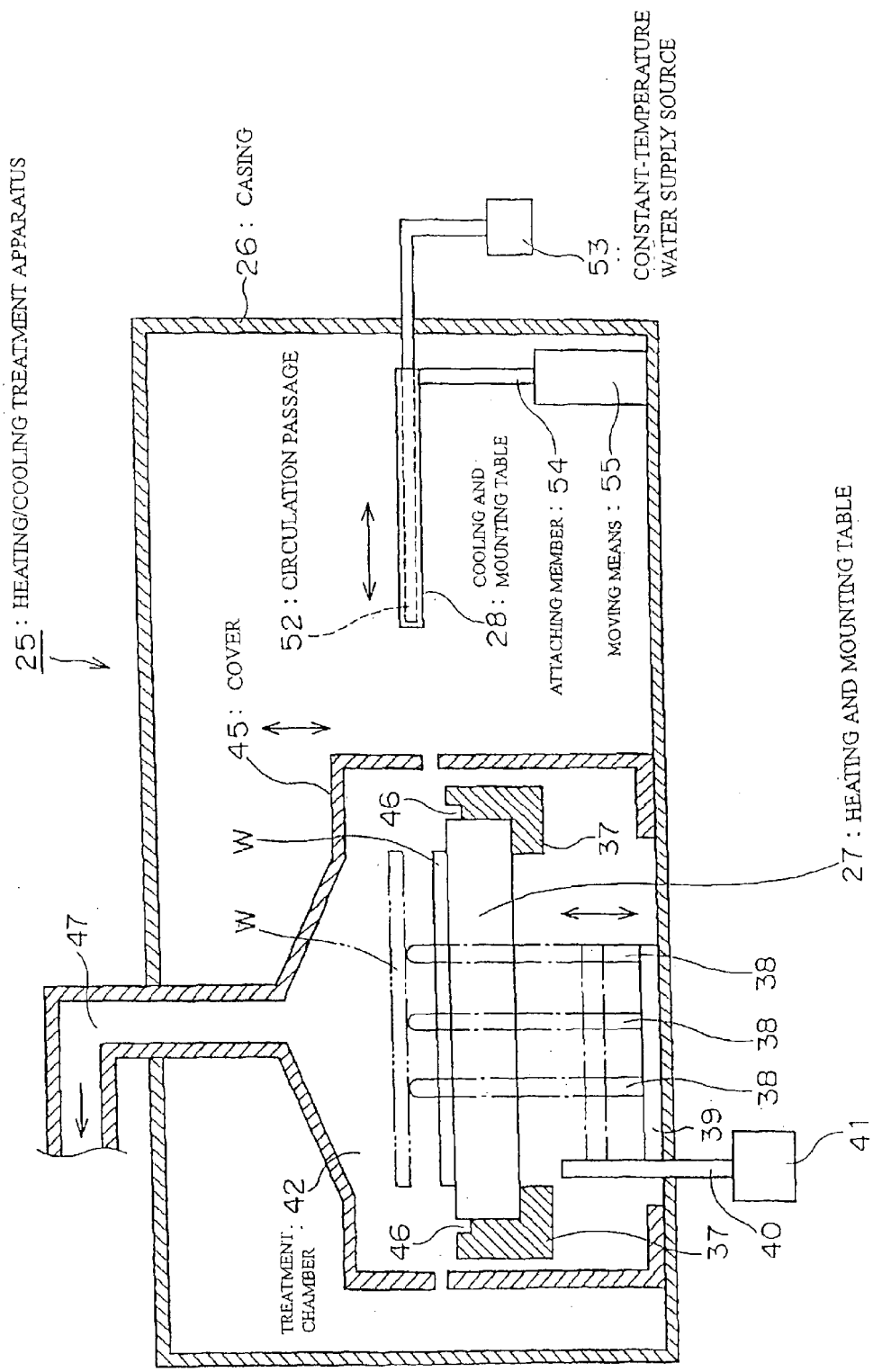
FIG. 3 is a rear view of the film-forming system shown in FIG. 1.

FIG. 1 is a plane view of a film-forming system according to an embodiment of the present invention, FIG. 2 is a front view of the film-forming system shown in FIG. 1, and FIG. 3 is a rear view of the film-forming system shown in FIG. 1.

As shown in FIG. 1 to FIG. 3, a film-forming system 1 has a configuration in which a cassette station 2 and a process station 3 are united. In the cassette station 2, a plurality of wafers W per cassette C, for example, 25 wafers W are carried in the film-forming system 1 from the outside and carried out of the film-forming system 1 to the outside. Additionally, the wafers W are carried into/out of the cassette C. In the process station 3, various kinds of treatment units are multi-tiered at designated positions and each treatment unit gives a predetermined treatment to the wafers W one by one in a film-forming process.

In the cassette station 2, as shown in FIG. 1, a plurality of, for example, four cassettes C are mounted in a line in an X-direction (a vertical direction in FIG. 1), with the respective ways in/out for the wafers W opening to the process station 3 side at positions of positioning projections 10a on a cassettes mounting table 10. A wafer carrier 15, which can move in the direction of the disposition of the cassettes C (the X-direction) and in the direction of the disposition of the wafers W stored in the cassettes C (a Z-direction; a vertical direction), is movable along a carrier path 15a to be selectively accessible to each cassette C.

The wafer carrier 15 is also rotatable in a θ-direction and accessible to an alignment unit (ALIM) and an extension unit (EXT) included in multi-tiered units of a third treatment unit group G3 on the process station 3 side as described later.

In the process station 3, as shown in FIG. 1, a carrier unit 20 with a vertical carrier system is placed in a center portion thereof. Around the carrier unit 20, one or various kinds of treatment units are multi-tiered to compose a treatment unit group. In the film-forming system 1, four treatment unit groups G1, G2, G3, and G4 can be arranged. The first and second treatment unit groups G1 and G2 are arranged on the front side of the system, the third treatment unit group G3 is disposed adjacent to the cassette station 2, and the fourth treatment unit group G4 is disposed at the position facing to the third treatment unit group G3 across the carrier unit 20.

The carrier unit 20 is rotatable in the θ-direction and movable in the Z-direction, and can receive/send the wafer W from/to each treatment unit.

As shown in FIG. 2, in the first treatment unit group G1, two spinner-type supply units 4 which mount and rotate the wafer W on a spin chuck in a cup CP to supply a predetermined treatment solution onto a rotational center of the wafer W from a supply nozzle (not shown), are two-tiered. Also in the second treatment unit group G2 similarly to the first treatment unit group G1, two spinner-type supply units 4 are two-tiered. The predetermined treatment solution is a coating solution which oxidizes at high temperatures, more specifically, an organic coating solution such as plastic or the like can be given as an example.

As shown in FIG. 2, high efficiency filters 23 such as a ULPA filter are provided for the aforesaid zones (the cassette station 2 and the process station 3) respectively at the top of the film-forming system 1. Particles and organic elements are collected and removed from air which is supplied from the upstream side of the high efficiency filters 23 while the air passing the high efficiency filters 23. Accordingly, through the high efficiency filter 23, a down flow of clean air from the upper part is supplied in a direction shown by a solid line with an arrow or a dotted line with an arrow to the aforesaid cassettes mounting table 10, the carrier path 15a of the wafer carrier 15, the first and second treatment unit groups G1 and G2, and the third and fourth treatment unit groups G3 and G4.

In the third treatment unit group G3, as shown in FIG. 3, an oven-type treatment unit for mounting the wafer W on the mounting table and performing a predetermined treatment, for example, the alignment unit (ALIM) for positioning, the extension unit (EXT), and heat treatment units (BAKE) 41 for heat-treating are eight-tiered in total.

In the fourth treatment unit group G4, an oven-type treatment unit for mounting the wafer W on the mounting table and performing a predetermined treatment, for example, heat treatment units (BAKE) 41 for heat-treating are eight-tiered in total.

As described above, the unit group for supplying a coating solution and that for heat-treating are separated from each other, thereby reducing thermal interference from the heat treatment unit (BAKE) 41 to the supply unit 4. Specifically, in the embodiment, the temperature of heat treatment in the heat treatment unit (BAKE) 41 reaches about 400° C., so that the reduction of thermal interference is useful. Meanwhile, respective unit groups are multi-tiered so as to be gathered, thereby down-sizing the system and improving treatment efficiency. Specifically, making various kinds of units and gathering the units in one body as has been described enables a multi-tiered film to be efficiently formed.

Figure 4:
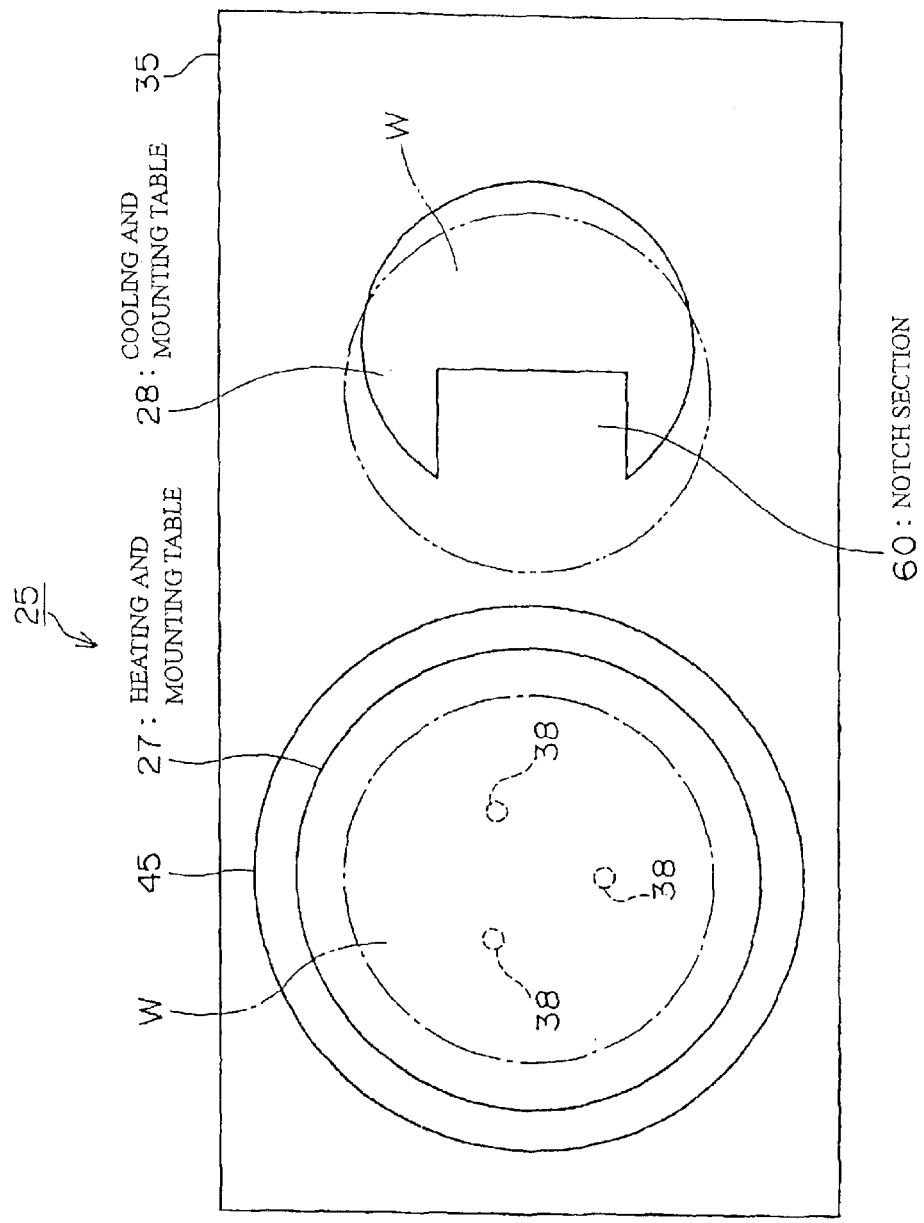
FIG. 4 is a front view of a heat treatment unit shown in FIG. 1.

FIG. 4 is a front view showing the structure of the aforesaid heat treatment unit (BAKE) 41.

As shown in FIG. 4, in the heat treatment unit (BAKE) 41, disposed are a heat treatment section 41a and a carrying apparatus 42 for carrying the wafer W into/out of the heat treatment unit (BAKE) 41 or the like. The inside of the heat treatment unit (BAKE) 41 is filled with an atmosphere of inert gas such as N2 gas, Ar gas, or the like. Thus, the coated film on the wafer W can be prevented from oxidizing while it is cooled and carried. Additionally, an N2 gas blowing nozzle 41f for blowing cooled inert gas such as cooled N2 gas is provided at a ceiling section of the heat treatment unit (BAKE) 41 above the carrying apparatus 42, for example. The cooled N2 gas is blown from the N2 gas blowing nozzle 41f into the heat treatment unit (BAKE) 41 while an atmosphere in the heat treatment section 41a is replaced so as to replace the inside of the heat treatment unit (BAKE) 41 with a cooled atmosphere with a low oxygen concentration, and thereby forced cooling is possible in a process of FIG. 7④ described later.

The carrying apparatus 42 has a base 43, on which a holding and cooling plate 44 for mounting and cooling the wafer W is placed. The holding and cooling plate 44 is movable forward and rearward to and from the heat treatment unit (BAKE) 41 by a driving mechanism (not shown). Further, a cooling mechanism 44a which is composed of, for example, a plurality of Peltier elements is embedded in the holding and cooling plate 44, so that the wafer W which is held by the holding and cooling plate 44 after being heat-treated by the heat treatment section 41a is rapidly cooled.

Figure 5:
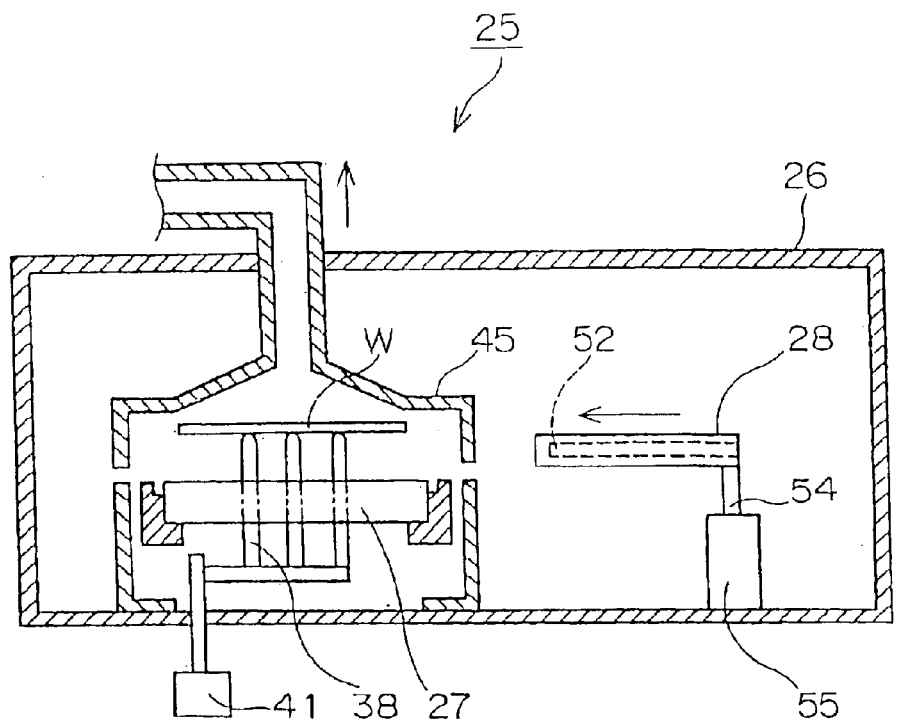
FIG. 5 is a plane view of the heat treatment unit shown in FIG. 4.

On a side wall of the heat treatment unit (BAKE) 41, as shown in FIG. 5, provided is an opening section 41c which can be opened and closed by a shutter 41b, so that the wafer W is sent and received between the carrier unit 20 which is positioned outside the opening section 41c and the holding and cooling plate 44.

Figure 6:
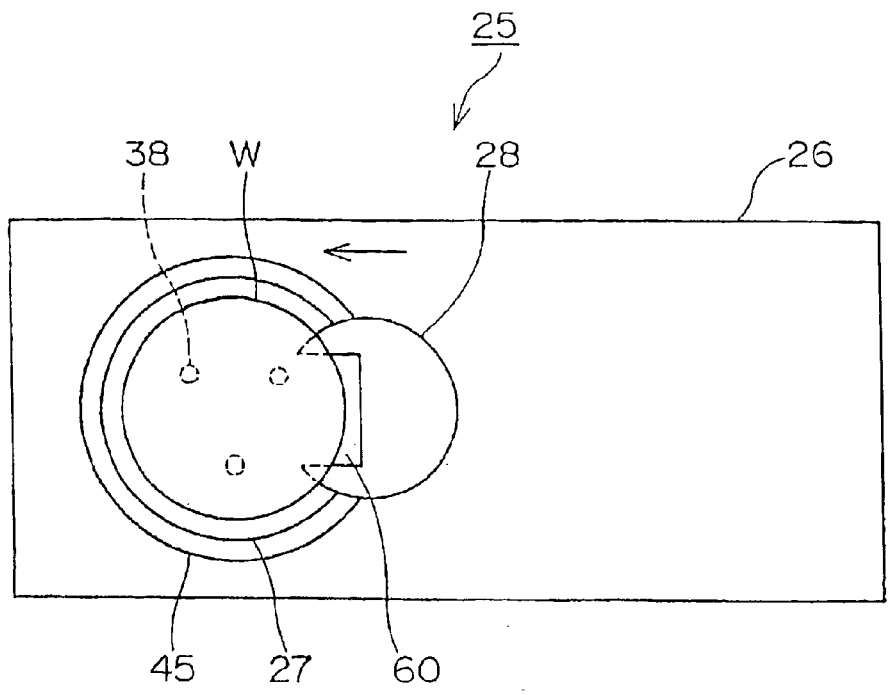
FIG. 6 is a view showing an example of an adjusting and supporting pin shown in FIGS. 4 and 5.
Figure 7:
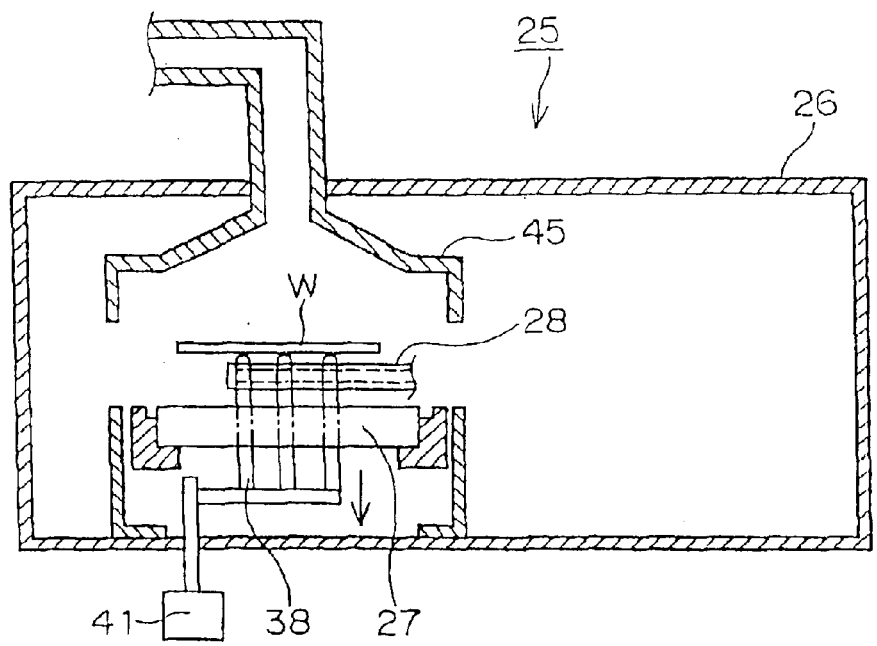
FIG. 7 is a diagram representing changes with the passage of time of the temperature of a wafer W in a heat treatment section and an oxygen concentration in the unit shown in FIGS. 4 and 5.

A plurality of, for example, four adjusting and supporting pins 45 are arranged on a surface of the holding and cooling plate 44 so as to support the wafer W to be parted from the holding and cooling plate 44. Each adjusting and supporting pin 45 is screwed, as shown in FIG. 6, to the holding and cooling plate 44. Thereby, the space between the surface of the holding and cooling plate 44 and the adjusting and supporting pins 45 can be adjusted. Accordingly, a fine adjustment for an appropriate cooling can be easily performed with a very simple structure. For example, there is a case that a temperature-falling rate at the time of cooling is required to be changed corresponding to the film-thickness of the wafer W. In this embodiment, the space between the surface of the holding and cooling plate 44 and the adjusting and supporting pins 45 is adjusted, thereby allowing the temperature-falling rate (④ of FIG. 7) to become changeable as shown in FIG. 7. The others of FIG. 7 will be described later.

Figure 8:
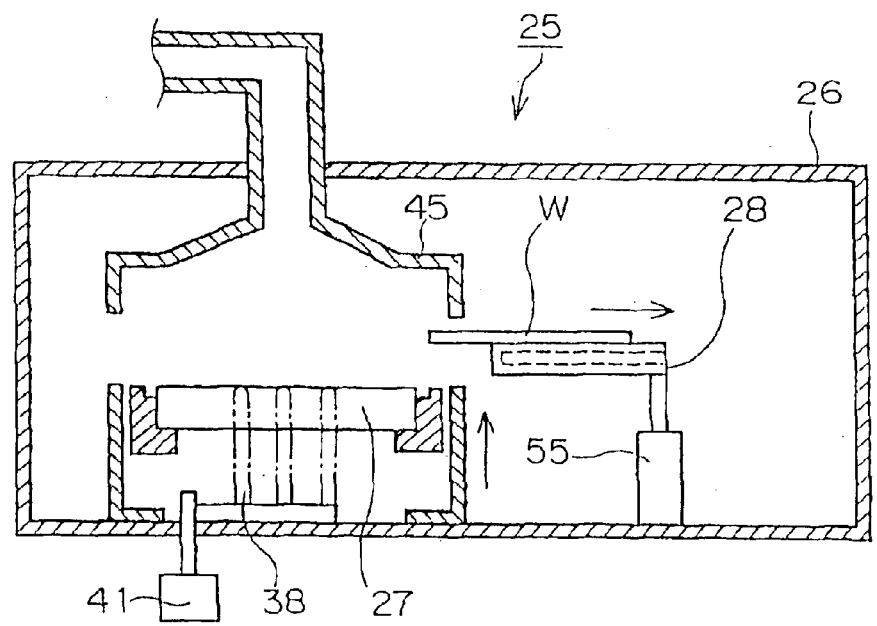
FIG. 8 is a plane view of the heat treatment section shown in FIGS. 4 and 5.

As shown in FIGS. 4 and 8, a hot plate 31 for heat-treating the wafer W is placed near the center of the heat treatment section 41a. A hot wire, for example, is buried in the hot plate 31 so that the surface-temperature of the hot plate 31 becomes, for example, approximately 400° C. when heat-treating. The hot plate 31 is provided with a plurality of, for example, three support pins 32 in a manner to appear and disappear for sending and receiving the wafer W, so that the support pins 32 are vertically moved by a hoisting and lowering mechanism 33 which is placed on the rear face of the hot plate 31.

Around the hot plate 31, an N2 gas blowing duct 34 is provided in a manner to surround the hot plate 31. The N2 gas blowing duct 34 is provided with a number of blowing nozzles 35, from which N2 gas is blown into the unit. In place of N2 gas, other inert gas such as Ar gas or the like can be used.

A lid body 36 is placed above the hot plate 31 to form an airtight space between the lid body 36 and the hot plate 31. The lid body 36 is vertically movable by a hoisting and lowering mechanism 41d. Further, the lid body 36 is structured to incline upward to the center thereof and an exhaust port 37 is provided at the center of the lid body 36. The exhaust port 37 is connected to an exhaust apparatus 41e such as a vacuum pump or the like.

As has been described, the N2 gas blowing duct 34 is disposed at the bottom part, the exhaust port 37 is disposed at the top part, and further the exhaust port 37 is structured as above, thereby efficiently replacing the inside of the heat treatment section 41a with N2 gas.

Next, actions in the heat treatment unit (BAKE) 41 structured as above will be described hereinafter. It should be noted that FIG. 7 represents changes with the passage of time of the temperature of the wafer W in the heat treatment section 41a and an oxygen concentration in the unit.

Figure 9:
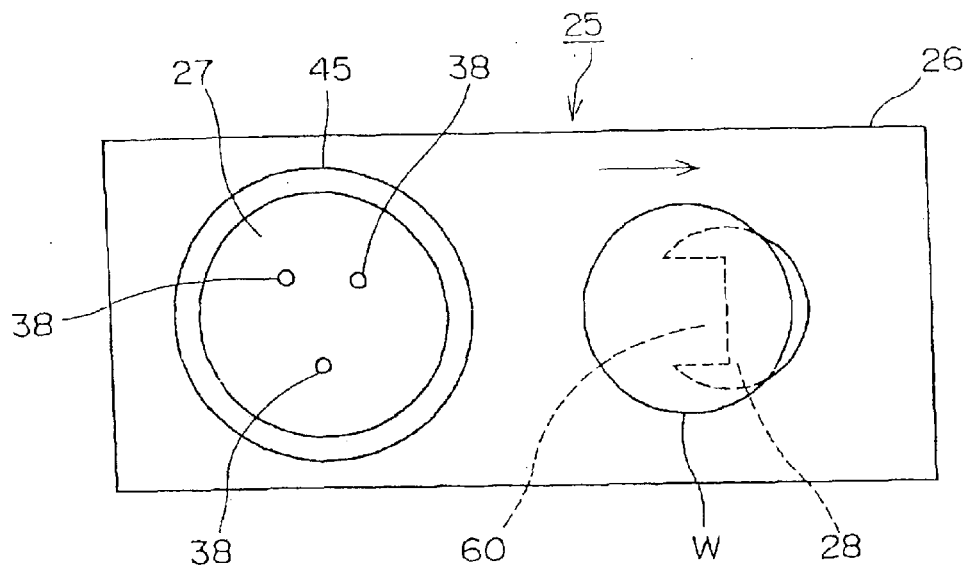
FIG. 9 is a front view showing the motion of the heat treatment section shown in FIGS. 4 and 5.

First, the wafer W is sent from the carrier unit 20 through the opening section 41c onto the holding and cooling plate 44. Next, the wafer W which is coated with the coating solution is sent from the holding and cooling plate 44 onto the support pins 32 in a state where the support pins 32 appear from the hot plate 31 and the lid body 36 opens in the heat treatment section 41a. Thereafter, the gas in the unit is discharged from the exhaust port 37 while N2 gas is blown from the blowing nozzles 35 of the N2 gas blowing duct 34, as shown in FIG. 9, in a state where the lid body 36 closes and the support pins 32 projecting from the hot plate 31 support the wafer W. Thereby the inside of the unit is replaced with N2 gas without the wafer W being heated to high temperatures (a period of FIG. 7①). The period of ① is preferably about 30 seconds, for example.

Figure 10:
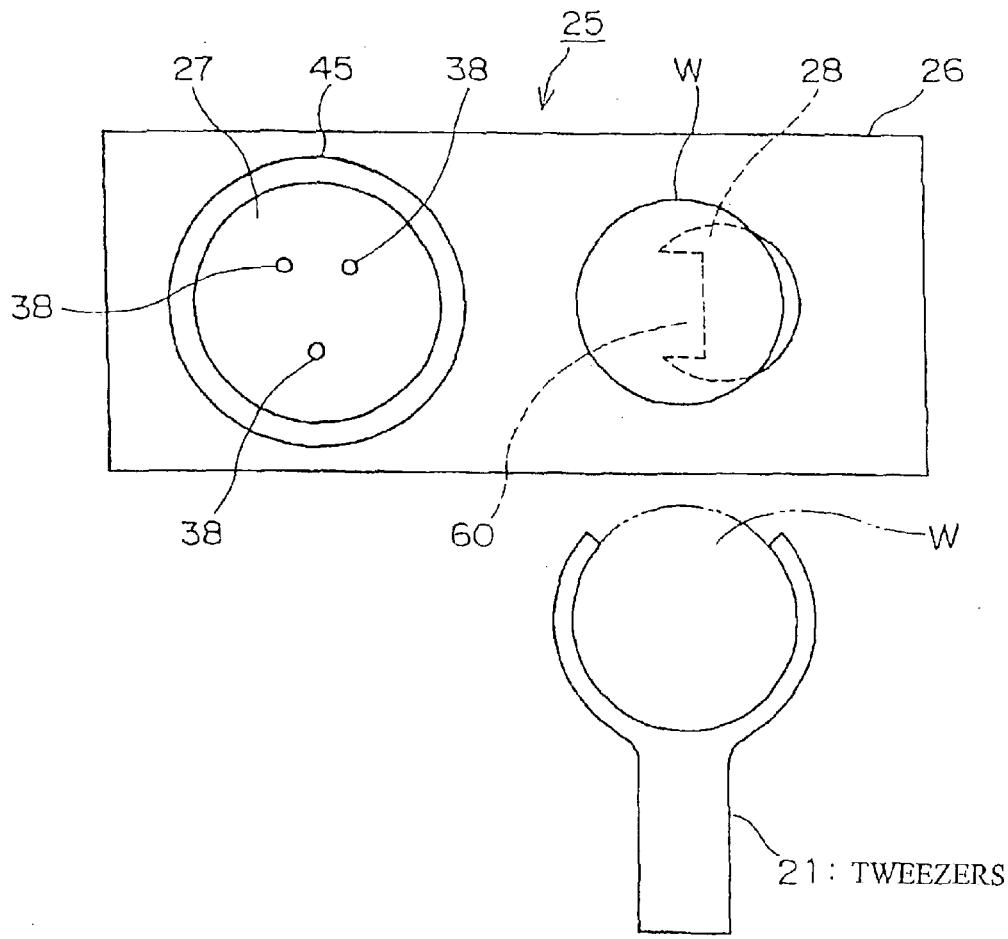
FIG. 10 is a front view showing the motion of the heat treatment section shown in FIGS. 4 and 5.

Next, as shown in FIG. 10, the support pins 32 withdraw into the hot plate 31, which allows the wafer W to abut on a surface of the hot plate 31 (a period of FIG. 7②). The period of ② is preferably about 70 seconds, for example. Thereby, the wafer W is heat-treated at approximately 400° C. However, since the inside of the unit is filled with N2 atmosphere at that time, the coating solution applied to the surface of the wafer W does not oxidize.

Next, as shown in FIG. 9, the support pins 32 project from the hot plate 31, which allows the wafer W to be separated from the surface of the hot plate 31. The lid body stands closed, for example, for about ten seconds. Thereby, the temperature of the wafer W can be lowered to a value at which the coated film does not oxidize in N2 atmosphere. Thereafter, the lid body 36 is opened to expose the inside of the treatment chamber to the air (a period of FIG. 7 ③). The period of ③ is preferably approximately 30 seconds, for example. Sequentially, being sent onto the holding and cooling plate 44, the wafer W is sent to the carrier unit 20 through the opening 41c.

As has been described, according to the embodiment, when the wafer W coated with the coating solution is heat-treated, the atmosphere in which heat treatment is performed is replaced with N2 gas. Therefore the wafer W can be heat-treated, while the oxidization of the coating solution is controlled.

Figure 11:
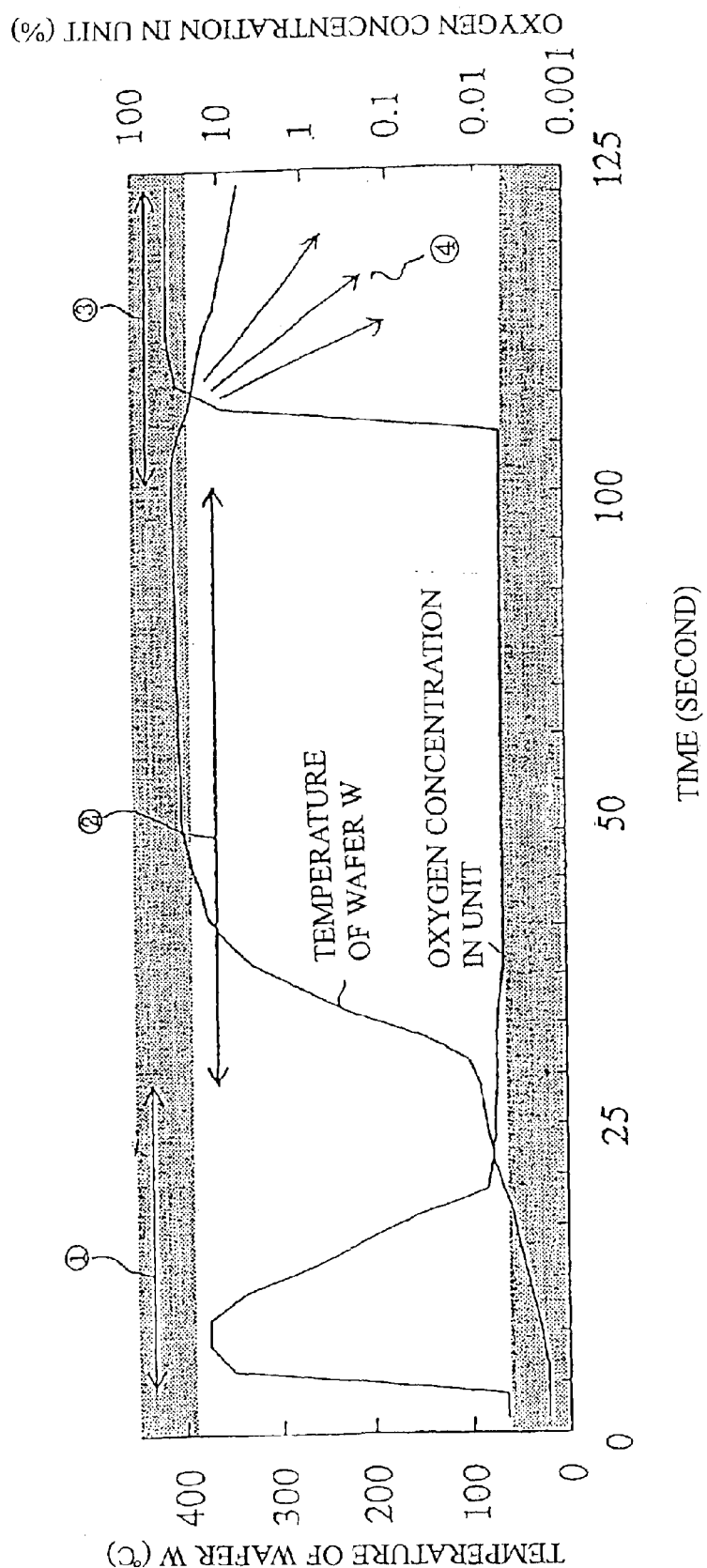
FIG. 11 is a block diagram showing a modification of the heat treatment section of the embodiment.

In the above embodiment, atmospheric-opening is performed after a predetermined time. Alternately, for example, a means for measuring temperature such as a thermo-couple (for instance, provided in the hot plate) to measure the temperature of the wafer W to be heat-treated may be provided so that exposure to the air may be performed when the temperature of the wafer W becomes lower than a predetermined value. Thereby, exposure to the air can be performed after the temperature of the wafer W has fallen thoroughly, resulting in more efficiently preventing the coated film from oxidizing. At that time, the blowout of N2 gas which is blown from the blowing nozzles 35 of the N2 gas blowing duct 34 may be controlled. For example, as shown in FIG. 11, an opening and closing valve 82 is provided between the N2 gas blowing duct 34 and an N2 gas source 81 so as to be opening-and-closing controlled by a control section 83. The opening and closing valve 82 is opened to blow N2 gas from the blowing nozzles 35 of the N2 gas blowing duct 34 until the temperature of the wafer W becomes lower than a predetermined value based on the measured results by the means for measuring temperature. When the temperature of the wafer W has become lower than the predetermined value, the opening and closing valve 82 is closed to stop the blowout of N2 gas from the blowing nozzles 35 of the N2 gas blowing duct 34.

Next, another embodiment of the present invention will be described hereinafter.

Figure 12:
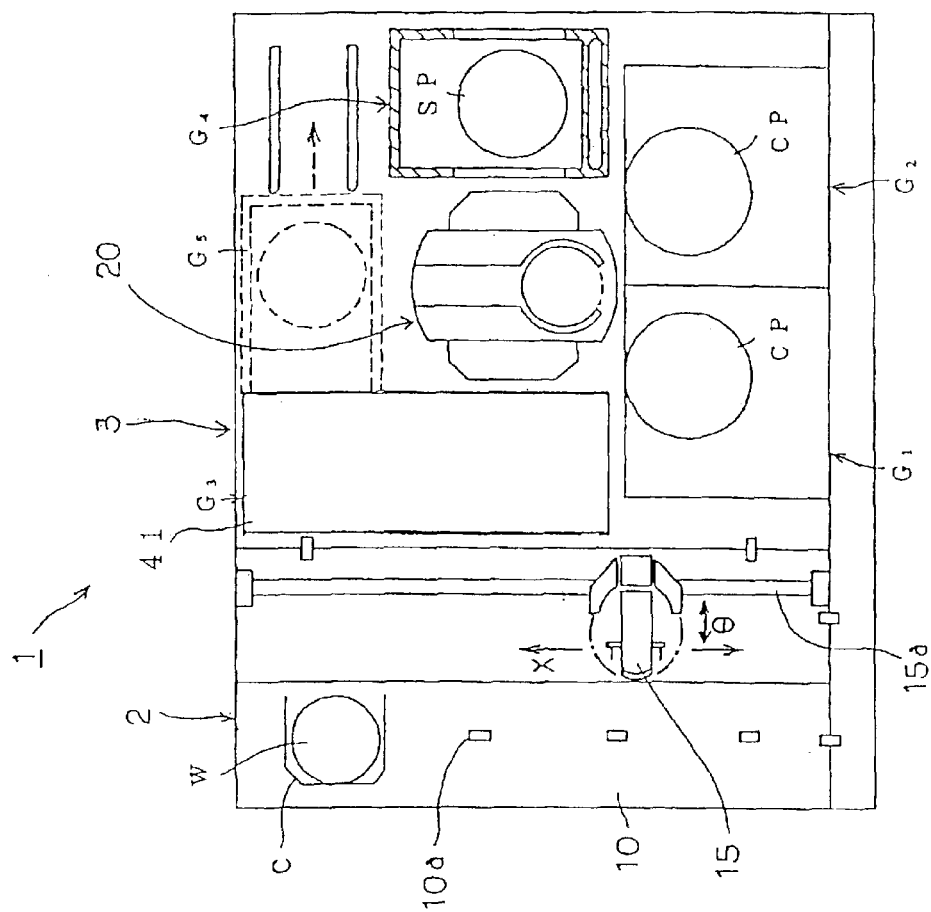
FIG. 12 is an explanatory view of a coating and developing system having a heating/cooling treatment apparatus according to another embodiment of the present invention.
Figure 13:
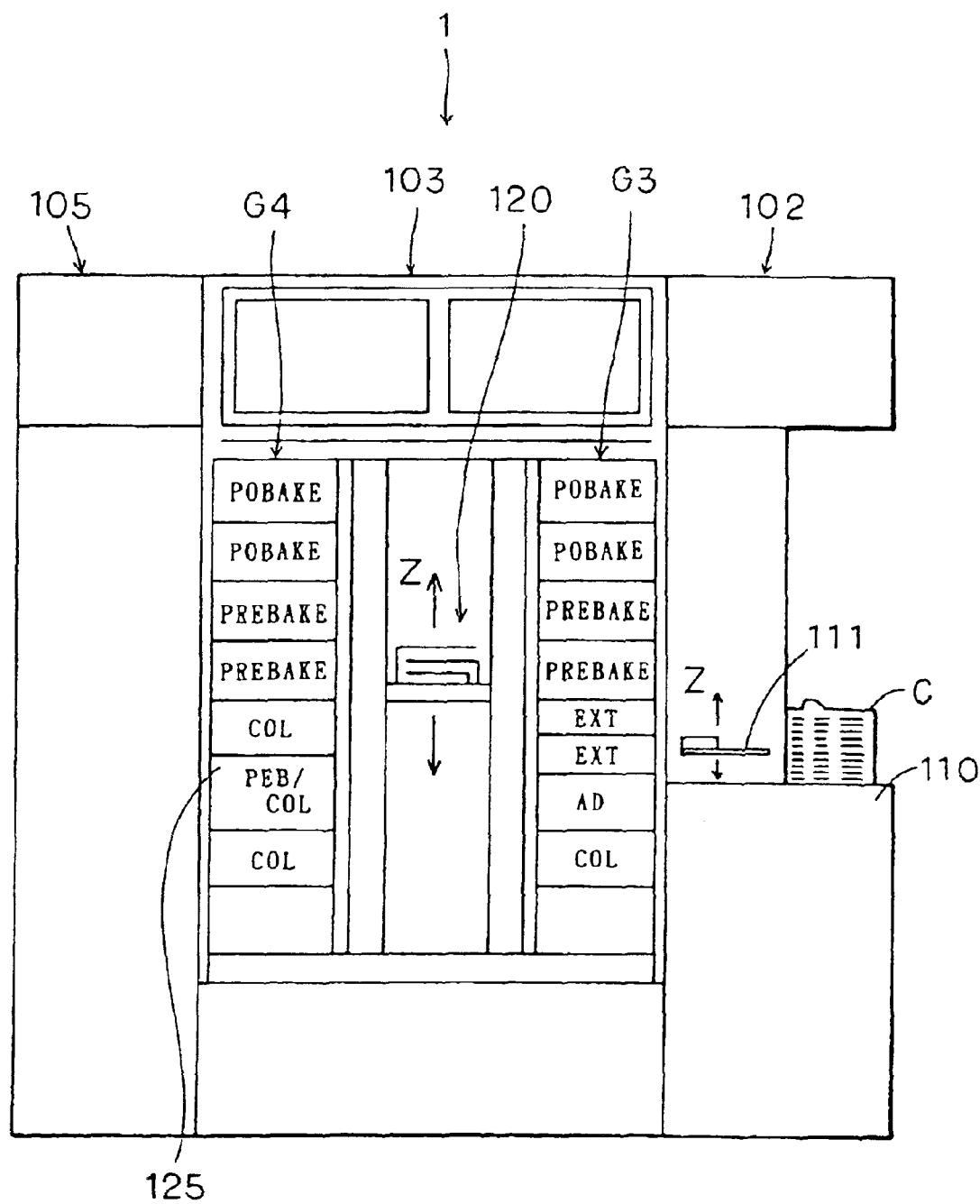
FIG. 13 is a rear view of the coating and developing system of FIG. 12.

The embodiment is realized as a heating/cooling treatment apparatus capable of performing heat treatment and cooling treatment to the exposed wafer in a single apparatus. FIGS. 12 and 13 show an appearance of a coating and developing system having the heating/cooling treatment apparatus according to the embodiment, FIG. 12 showing an aspect seen from the plane and FIG. 13 from the rear respectively.

A coating and developing system 101, as shown in FIG. 12, has a configuration in which a cassette station 102 for carrying 25 wafers W, for example, per cassette C into/out of the coating and developing system 101 from/to the outside and carrying the wafers W into/out of the cassette C, a process station 103 in which various kinds of treatment units are multi-tiered and each treatment unit gives a predetermined treatment to the wafers W and an interface section 105 for sending and receiving the wafer W to/from an aligner 104 which is disposed adjacent to the process station 103 are united.

In the cassette station 102, for example, a maximum of four cassettes C are mounted in a line in an X-direction (a vertical direction in FIG. 12), with the respective ways in/out for the wafers W opening to the process station 103 side at positions of positioning projections 110a on a cassettes mounting table 110 which serves as a mounting section. A wafer carrier 111, which can move in the direction of the disposition of the cassettes C (the X-direction) and in the direction of the disposition of the wafers W stored in the cassettes C (a Z-direction; a vertical direction), is movable along a carrier path 112 to be selectively accessible to each cassette C. The wafer carrier 111 is also rotatable in a θ-direction and accessible to the alignment unit (ALIM) and the extension unit (EXT) included in multi-tiered units of a third treatment unit group G3 on the process station 103 side as described later.

In the process station 103, a main carrier unit 120 is placed in a center portion thereof, which is vertically provided with, for example, three pairs of tweezers 121 which have the same configuration for holding the wafer W. Around the main carrier unit 120, one or various kinds of treatment units are multi-tiered to compose a treatment unit group. In the coating and developing system 101, five treatment unit groups G1, G2, G3, G4, and G5 can be arranged. The first and the second treatment unit groups G1 and G2 are arranged on the front side of the coating and developing system 101, the third treatment unit group G3 is disposed adjacent to the cassette station 102, and the fourth and fifth treatment unit groups G4 and G5 are disposed adjacent to the interface section 105.

In the first treatment unit group G1, two spinner-type treatment units for mounting and treating the wafer W on a spin chuck (not shown) in a cup CP, for example, a resist coating unit and a developing unit are two-tiered from the bottom in order. Also in the second treatment unit group G2 similarly to the first treatment unit group G1, the spinner-type treatment units, for example, the resist coating unit and the developing unit are two-tiered from the bottom in order.

In the third treatment unit group G3, as shown in FIGS. 12 and 13, treatment units for mounting the wafer W on the mounting table and performing predetermined treatments, for example, a cooling treatment unit (COL) for performing cooling treatment, an adhesion unit (AD) for improving fixing of the wafer W and resist, the extension unit (EXT) for keeping the wafer W on standby, a prebaking unit (PREBAKE) and a postbaking unit (POBAKE) for performing heat treatment, and the like are seven-tiered.

In the fourth and fifth treatment unit groups G4 and G5, as shown in FIGS. 12 and 13, treatment units for mounting the wafer W on the mounting table and performing predetermined treatments, for example, the cooling treatment unit (COL), the prebaking unit (PREBAKE), the postbaking unit (POBAKE), and additionally a heating/cooling treatment apparatus 125 according to the embodiment of the present invention, are seven-tiered in total. When the coating and developing system 101 is seen from the rear, the fourth treatment unit group G4 and the fifth treatment unit group G5 overlap each other, therefore the fifth treatment unit group G5 is omitted in FIG. 13.

The heating/cooling treatment apparatus 125 is provided with both a heating and mounting table 127 for performing heat-treatment of the wafer W and a cooling and mounting table 128 for performing cooling treatment of the wafer W in a casing 126. The respective heating and mounting tables 127 which belong to the fourth and fifth treatment unit groups G4 and G5 are faced to each other, thereby preventing the occurrence of heat interference between the heating/cooling treatment apparatuses 125 belonging to the fourth and fifth treatment unit groups G4 and G5.

Further, the respective spinner-type treatment units of the first and second treatment unit groups G1 and G2 and the cooling and mounting table 128 belonging to the treatment unit group G5 are arranged to be close to each other so as not to have an adverse thermal effect on the spinner-type treatment units which are prone to be affected by a change in temperature.

At the center of the interface section 105, a wafer carrier 130 is provided. The wafer carrier 130 is movable in the X-direction along a rail 131 and the Z-direction (vertical direction) and rotatable in the θ-direction to be accessible to the aligner 104, the respective heating and mounting tables 127 of the heating/cooling treatment apparatuses 125 belonging to the fourth and fifth treatment unit groups G4 and G5, and a peripheral aligner 132.

The coating and developing system 101 is structured as described above. Next, the configuration of the heating/cooling treatment apparatus 125 provided in the coating and developing system 101 will be explained hereinafter.

Figure 14:
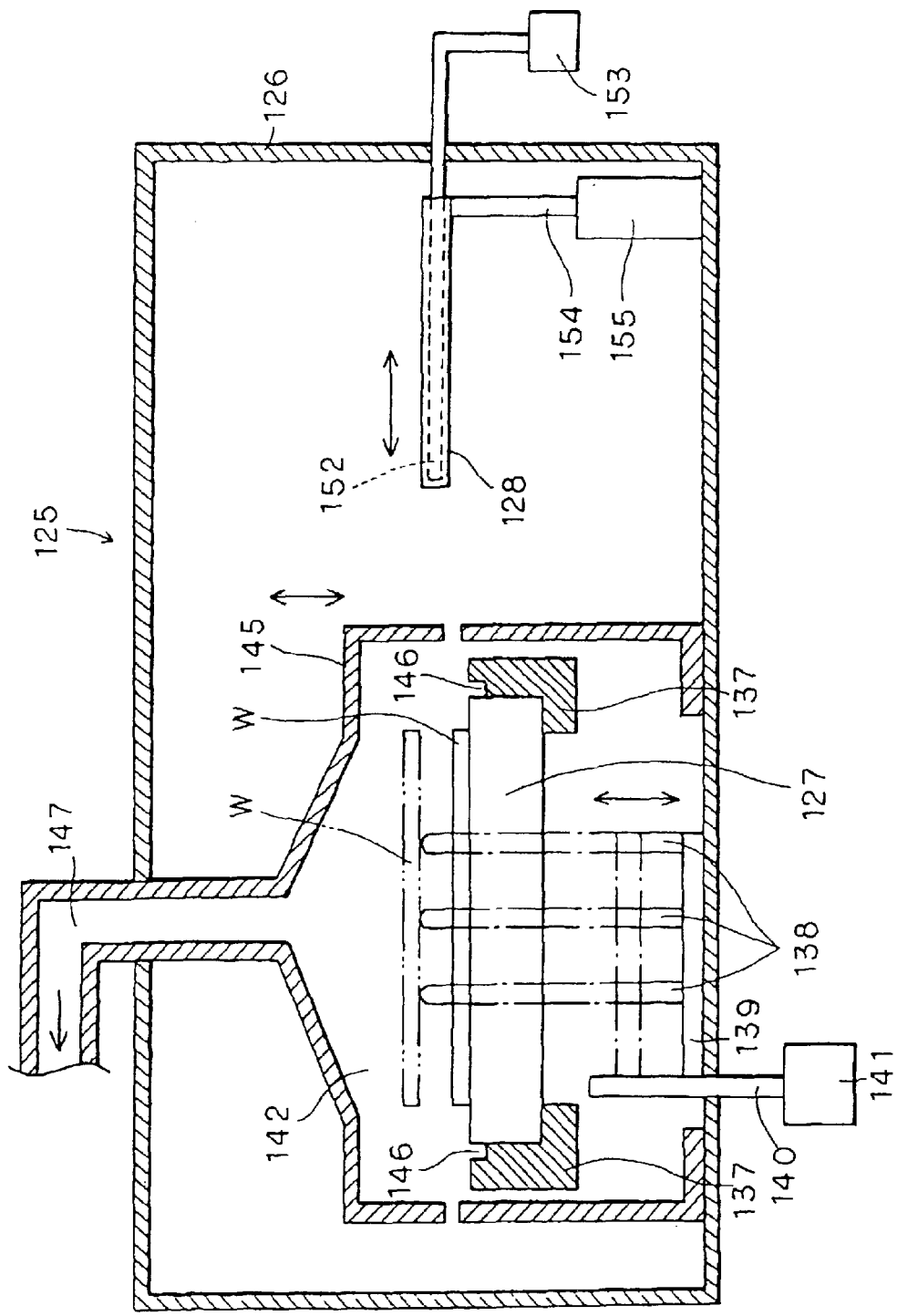
FIG. 14 is a vertical sectional view of the heating/cooling treatment apparatus according to another embodiment of the present invention.
Figure 15:
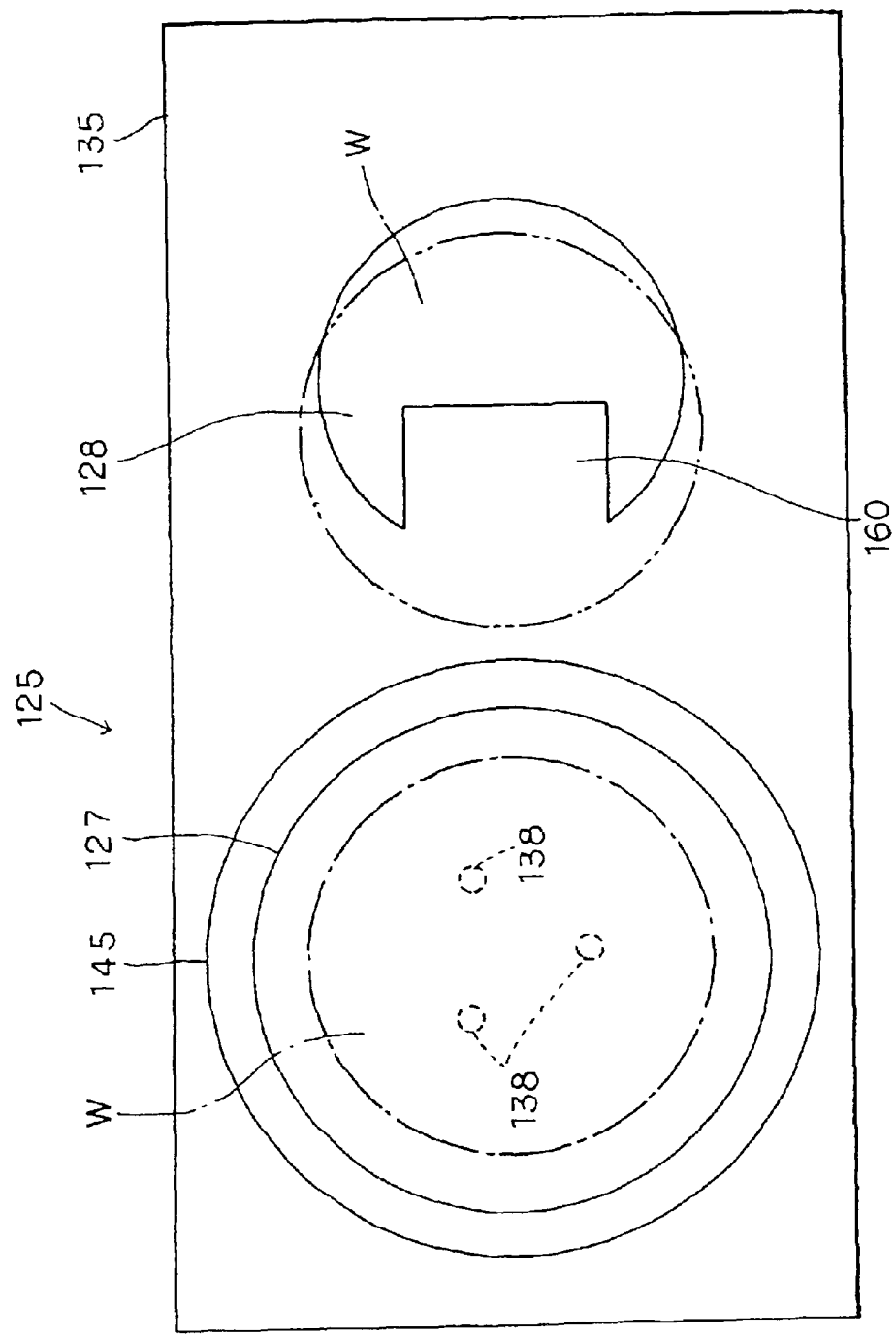
FIG. 15 is an explanatory view of the heating/cooling treatment apparatus shown in FIG. 14 seen from the plane.

As shown in FIGS. 14 and 15, the plane configuration of the heating and mounting table 127 is formed in a round shape. The heating and mounting table 127 is held by a ring-shaped holding member 137. Inside the heating and mounting table 127, a heating mechanism (not shown) such as a heater is buried for heat-treating the wafer W and three holes (not shown) piercing from the top to the bottom are provided. In holes (not shown), three hoisting and lowering pins 138 for supporting the rear face of the wafer W are inserted respectively. The bottom end of each hoisting and lowering pin 138 is connected to a bracket 139, which vertically moves with a hoisting and lowering mechanism 140 driven by a motor 141. Accordingly, the wafer W supported by the hoisting and lowering pins 138 is vertically movable in a treatment chamber 142.

The heating/cooling treatment apparatus 125 is provided with a cover 145 which has a shape covering the heating and mounting table 127, the cover 145 is provided with an exhaust duct 147. The holding member 137 is provided with an N2 purge port 146 for blowing nitrogen gas (N2 gas) into the treatment chamber 142. The N2 purge port 146 may be provided in the cover 145. The cover 145 is vertically moved by the operation of an appropriate hoisting and lowering mechanism (not shown).

The cooling and mounting table 128 has a smaller diameter than the wafer W and a circulation passage 152 is formed inside the cooling and mounting table 128. The circulation passage 152 is connected with a constant-temperature water supply source 153 for supplying, for example, constant-temperature water or the like which is temperature-controlled to 23° C. Unless the constant-temperature water is needed, tap water or the like can be supplied in the circulation passage 152.

The cooling and mounting table 128 is connected to a moving means 155 by the medium of an attaching member 154 and is movable toward the heating and mounting table 127 by the movement of the moving means 155. The cooling and mounting table 128 may be vertically moved by a motor (not shown) or the like. Further, in the cooling and mounting table 128, a notch section 160 is formed at the heating and mounting table 127 side as shown in FIG. 15. The notch section 160 is formed in a manner not to touch the hoisting and lowering pins 138.

The heating/cooling treatment apparatus 125 according to the embodiment of the present invention is structured as has been described. Next, the effects of the heating/cooling treatment apparatus 125 will be explained hereinafter.

The wafer W of which a predetermined exposing treatment is completed in the aligner 104 is carried into the heating and mounting table 127 of the heating/cooling treatment apparatus 125 belonging to the fourth treatment unit group G4 or the fifth treatment unit group G5 by the wafer carrier 130 to be treated with a predetermined heat-treatment.

The wafer carrier 130 directly carries the exposed wafer W from the aligner 104 onto the heating and mounting table 127, therefore eliminating the need for a process of sending the wafer W from the wafer carrier 130 to the main carrier unit 120 as in conventional art. As a result, time for carrying the wafer W is shortened and through-put can be improved.

Figure 16:
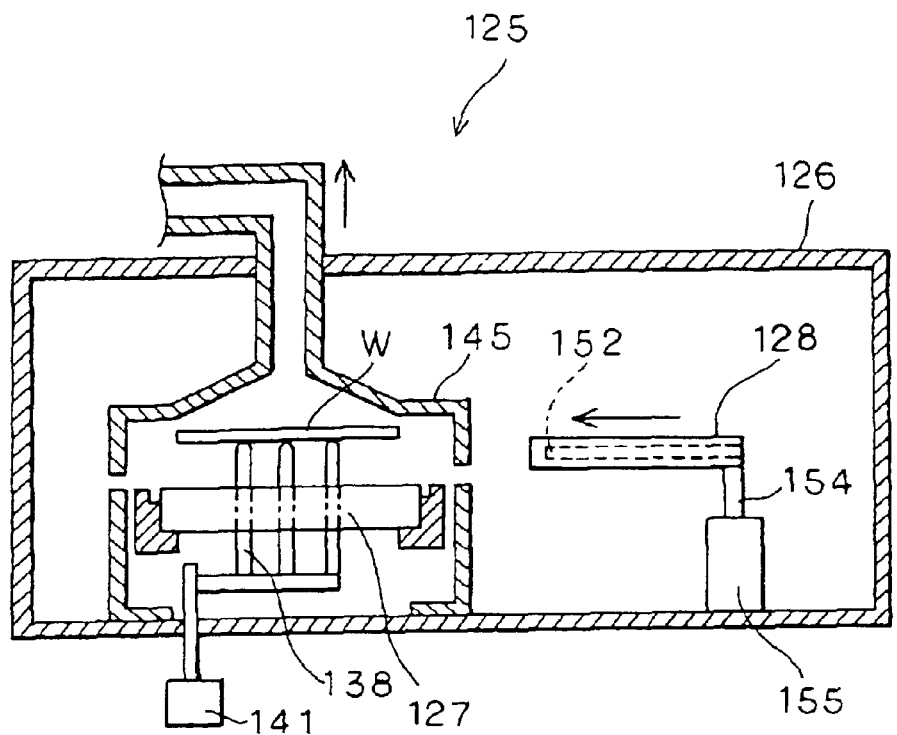
FIG. 16 is an explanatory view showing a manner of the movement of a cooling and mounting table provided in the heating/cooling treatment apparatus of FIG. 14.
Figure 17:
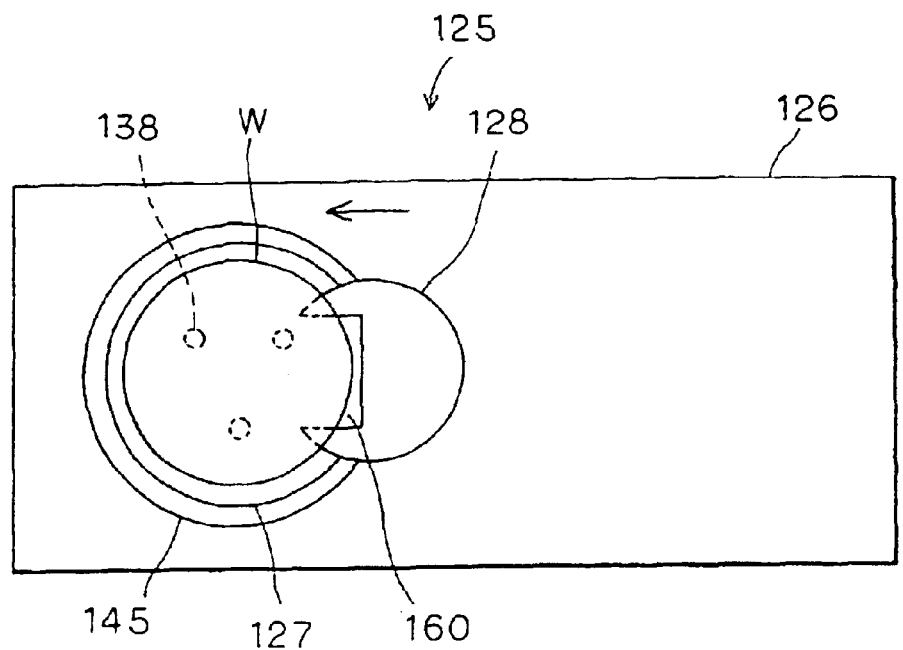
FIG. 17 is an explanatory view showing an aspect of the heating/cooling treatment apparatus in the state of FIG. 16 seen from the plane.

Sequentially, as shown in FIG. 16, the wafer W of which a predetermined heat treatment is completed on the heating and mounting table 127 is moved up by the hoisting and lowering pins 138. There after the cooling and mounting table 128 is moved toward the heating and mounting table 127 by the moving means 155. With the movement of the cooling and mounting table 128, the cover 145 is moved up by the appropriate hoisting and lowering mechanism (not shown), which allows the cooling and mounting table 128 to enter between the upper face of the heating and mounting table 127 and the lower face of the wafer W supported by the hoisting and lowering pins 138. When entering, the cooling and mounting table 128, having the notch section 160, does not touch the hoisting and lowering pins 138. Accordingly, the cooling and mounting table 128 can enter, as shown in FIG. 17, to the back side above the heating and mounting table 127. Thereafter, the hoisting and lowering pins 138 are moved down, as shown in FIG. 18, and the wafer W is mounted on the cooling and mounting table 128. From this point in time, cooling treatment is started to the wafer W.

In the embodiment, the cooling and mounting table 128 does not touch the hoisting and lowering pins 138 due to the notch section 160. Therefore, the cooling and mounting table 128 can enter to the back side above the heating and mounting table 127, resulting in that a mounting face of the cooling and mounting table 128 can be made large. Consequently, the cooling treatment can be uniformly performed to the wafer W. Further, the speedy cooling treatment of the wafer W is also possible.

Moreover, as aforementioned, the cooling treatment can be performed from the point in time when the wafer W is mounted on the cooling and mounting table 128 immediately after completing the heat treatment in the heating/cooling treatment apparatus 125. Accordingly, deformation of the pattern is prevented.

When chemically-amplifying-type resist which is sensitive to change in temperature is used, the embodiment of the present invention is especially effective. The wafer W is rapidly cooling-treated to a temperature at which an amplifying reaction of resist does not proceed, for example, approximately 40° C. on the cooling and mounting table 128.

After the cooling and mounting table 128 on which the wafer W is mounted retreats from above the heating and mounting table 127 by the operation of the moving means 155 as shown in FIG. 19, the cover 145 descends. Except at the time of carrying the wafer W in/out, the heat generated on the heating and mounting table 127 is intercepted by the cover 145 not to spread outside. Also from this point, the required time for the cooling treatment is shortened.

Figure 20:
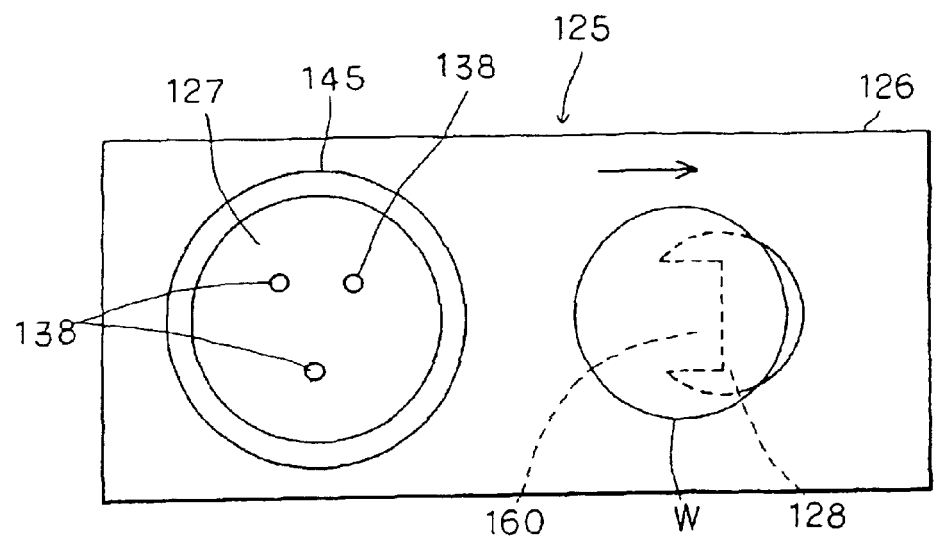
FIG. 20 is an explanatory view showing an aspect of the heating/cooling treatment apparatus in the state of FIG. 19 seen from the plane.
Figure 21:
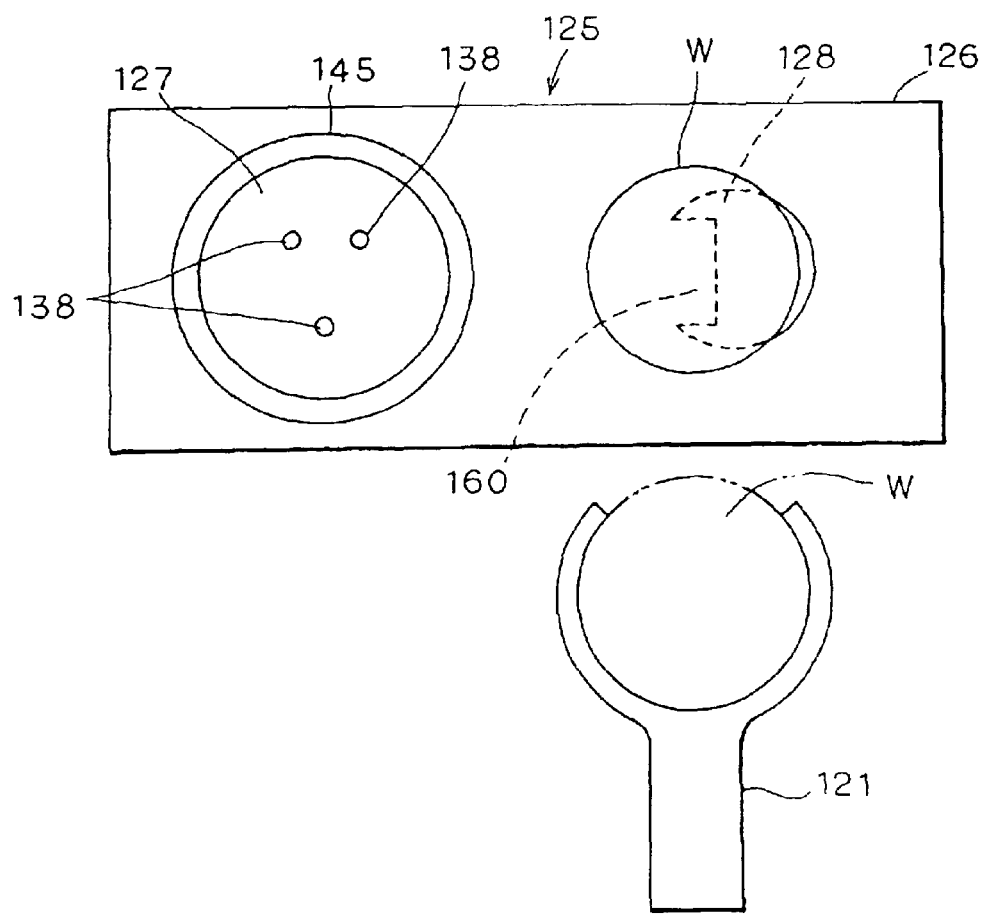
FIG. 21 is an explanatory view showing an aspect when the wafer mounted on the cooling and mounting table of FIG. 19 is delivered to a pair of tweezers.

Sequentially, the cooling and mounting table 128 moves to the original predetermined position, performing the cooling treatment to the wafer W as shown in FIG. 20. During the movement, the wafer W is cooled to a predetermined temperature at which an amplifying reaction of resist does not proceed, for example, approximately 40° C. After the cooling and mounting table 128 moves to the predetermined position, the tweezers 121 provided at the main carrier unit 120 receive the wafer W from the cooling and mounting table 128 as shown in FIG. 21 and support the wafer W as shown by a two-dotted line of the drawing. Thereafter, the wafer W is carried into the developing unit by the main carrier unit 120 to be treated with a predetermined development.

In the embodiment, the example in which the heat generated on the heating and mounting table 127 is intercepted by the cover 145 has been explained. The present invention, however, is not limited to the example, a member which intercepts the spread of a heat atmosphere such as a heat insulating material may be vertically movable, for example, between the heating and mounting table 127 and the cooling and mounting table 128.

According to the above structure, the heat generated on the heating and mounting table 127, intercepted by the insulating material, does not spread in the casing 126, thereby avoiding heat interference between the heating and mounting table 127 and the cooling and mounting table 128. Consequently, the cooling and mounting table 128 is not adversely affected by the heat generated on the heating and mounting table 127 similarly to the case of using the cover 145. Alternatively, the heating and mounting table 127 is covered with a cover and the wafer W is positioned above the cover, which also enables the wafer W to be cooled.

The cooling and mounting table 128 cools the wafer W with the constant-temperature water which flows in the circulation passage 152. In the present invention, however, the cooling and mounting table 128 is only for cooling the wafer W to a predetermined temperature, therefore gas such as nitrogen gas or air which is controlled in temperature may flow in the circulation passage 152, for example.

In the aforementioned embodiment, the diameter of the cooling and mounting table 128 is smaller than that of the wafer W. Instead of that, a cooling and mounting table having a larger diameter than the wafer W and/or including hoisting and lowering pins can be employed in the present invention. According to the above cooling and mounting table, the wafer can be sent/received in the same manner as the heating and mounting table.

Furthermore, Peltier elements may be provided at the cooling and mounting table 128 instead of the circulation passage 152. The above structure enables the cooling and mounting table 128 to be made further smaller and simpler. Consequently, the movable structure of the cooling and mounting table can be more easily realized.

Moreover, the example where the wafer W is used for a substrate has been described and the present invention, not limited to the example, can be also employed in the case where an LCD substrate is used.

The aforesaid embodiments have the intention of clarifying technical meaning of the present invention. Therefore, the present invention is not intended to be limited to the above concrete embodiments or to be interpreted in a narrow sense, and various changes may be made therein without departing from the spirit of the present invention and within the meaning of the claims.

What is claimed is:

1. A method to heat-treat a substrate coated with a coating solution which oxidizes at a high temperature, said method comprising the steps of:
    (a) lowering an oxygen concentration of a treatment atmosphere in a heating chamber when a temperature of the substrate in the heating chamber is lower than the temperature at which the coating solution oxidizes;
    (b) heat-treating the substrate in the treatment atmosphere of which the oxygen concentration has been lowered so as not to cause oxidation to the coating solution;
    (c) returning the treatment atmosphere to that with the original oxygen concentration after completing said heat treatment; and
    (d) removing the substrate from the heating chamber by a moving mechanism having a cooling unit while cooling the substrate by the cooling unit to a temperature lower than the temperature at which the coating solution oxidizes.

2. The method as set forth in claim 1,
    wherein said step (c) returns the treatment atmosphere to that with the original oxygen concentration after the passage of a predetermined time from the completion of said heat treatment.

3. The method as set forth in claim 1,
    wherein the coating solution is an organic coating solution.

4. The method as set forth in claim 1,
    wherein the step (c) exposes the substrate to air after the passage of a predetermined time from the completion of said heat treatment.

5. The method as set forth in claim 1,
    wherein said step (c) returns the treatment atmosphere to that with the original oxygen concentration when the temperature of the substrate becomes lower than a predetermined value.

6. The method as set forth in claim 1,
    wherein said step (c) exposes the substrate to air when the temperature of the substrate becomes lower than a predetermined value.

7. The method as set forth in claim 1, wherein said step (a) replaces the treatment atmosphere with inert gas when the temperature is lower than the temperature at which the coating solution oxidizes.

8. A method to heat-treat a substrate coated with a coating solution which oxidizes at a high temperature, said method comprising the steps of:
   (a) lowering an oxygen concentration of a treatment atmosphere in a heating chamber when a temperature of the substrate in the heating chamber is lower than the temperature at which the coating solution oxidizes while the substrate is being held on support pins capable of appearing and disappearing from and into a holding and heating member for supporting the substrate apart from the holding and heating member in the heating chamber;
   (b) heat-treating the substrate in the treatment atmosphere of which the oxygen concentration has been lowered so as not to cause oxidation to the coating solution
   (c) returning the treatment atmosphere to that with the original oxygen concentration after completing said heat treatment; and
   (d) removing the substrate from the heating chamber by a moving mechanism having a cooling unit while cooling the substrate by the cooling unit to a temperature lower than the temperature at which the coating solution oxidizes.

9. A method to heat-treat a substrate coated with a coating solution which oxidizes at a high temperature, said method comprising the steps of:
   (a) lowering an oxygen concentration of a treatment atmosphere in a heating chamber when a temperature of the substrate in the heating chamber is lower than the temperature at which the coating solution oxidizes;
   (b) heat-treating the substrate held on a supporting and heating member having support pins capable of appearing and disappearing from and into the holding and heating member in the treatment atmosphere, in the heating chamber, of which the oxygen concentration has been lowered so as not to cause oxidation to the coating solution;
   (c) returning the treatment atmosphere to that with the original oxygen concentration after completing said heat treatment; and
   (d) removing the substrate from the heating chamber by a moving mechanism having a cooling unit while cooling the substrate by the cooling unit to a temperature lower than the temperature at which the coating solution oxidizes.

10. A method to heat-treat a substrate coated with a coating solution which oxidizes at a temperature, said method comprising the steps of:
   (a) lowering an oxygen concentration of a treatment atmosphere in a heating chamber when a temperature of the substrate in the heating chamber is lower than the temperature at which the coating solution oxidizes;
   (b) heat-treating the substrate in the treatment atmosphere, in the heating chamber, of which the oxygen concentration has been lowered so as not to cause oxidation to the coating solution;
   (c) returning the treatment atmosphere to that with the original oxygen concentration after completing said heat treatment; and
   (d) removing the substrate from the heating chamber by a moving mechanism having a cooling unit while cooling the substrate by the cooling unit to a temperature lower than the temperature at which the coating solution oxidizes, the substrate being apart from the cooling unit by supporting pins disposed adjustably in height on the cooling unit.

11. A method to heat-treat a substrate in a heating chamber, the substrate being coated with a coating solution which oxidizes at a high temperature, said method comprising the steps of:
   heat-treating the substrate while controlling an oxygen concentration of a heat-treatment atmosphere in the heating chamber; and
   on completion of the heat-treating, removing the substrate from the heating chamber by a moving mechanism having a cooling unit while cooling the substrate by the cooling unit.

12. A method to heat-treat a substrate in a heating chamber having a cover, the substrate being coated with a coating solution which oxidizes at a high temperature, said method comprising the steps of:
   setting the substrate in the heating chamber and closing the cover of the heating chamber;
   lowering an oxygen concentration of a treatment atmosphere in the heating chamber while a temperature in the heating chamber is lower than the temperature at which the coating solution oxidizes;
   heat-treating the substrate in the oxygen-concentration-lowered treatment atmosphere;
   opening the cover when a specific time elapses from completion of the heat-treating; and
   removing the substrate from the cover-opened heating chamber by a moving mechanism having a cooling unit while cooling the substrate by the cooling unit.

13. A method to heat-treat a substrate in a heating chamber having a cover, the substrate being coated with an organic coating solution which oxidizes at a high temperature, said method comprising the steps of:
   setting the substrate in the heating chamber and closing the cover of the heating chamber;
   replacing a treatment atmosphere in the heating chamber with inert gas while a temperature in the heating chamber is lower than the temperature at which the coating solution oxidizes;
   heat-treating the substrate in the treatment atmosphere with the inert gas;
   opening the cover when a specific time elapses from completion of the heat-treating; and
   removing the substrate from the cover-opened heating chamber by a moving mechanism having a cooling unit while cooling the substrate by the cooling unit.

14. A method to heat-treat a substrate in a heating chamber having a cover, the substrate being coated with an organic coating solution which oxidizes at a high temperature, said method comprising the steps of:
   setting the substrate in the heating chamber and closing the cover of the heating chamber;
   replacing a treatment atmosphere in the heating chamber with inert gas while a temperature in the heating chamber is lower than the temperature at which the coating solution oxidizes;
   heat-treating the substrate in the treatment atmosphere with the inert gas;
   opening the cover when a temperature of the substrate is lowered at least to a specific temperature; and removing the substrate from the cover-opened heating chamber by a moving mechanism having a cooling unit while cooling the substrate by the cooling unit.

15. A method to heat-treat a substrate coated with a coating solution which oxidizes at a high temperature, said method comprising the steps of:

(a) lowering an oxygen concentration of a treatment atmosphere for a first period when a temperature of the substrate is lower than the temperature at which the coating solution oxidizes;

(b) heat-treating the substrate for a second period longer than the first period in the treatment atmosphere of which the oxygen concentration has been lowered so as not to cause oxidation to the coating solution;

(c) returning the treatment atmosphere to that with the original oxygen concentration for a third period shorter than the second period after completing said heat treatment; and (d) removing the substrate from the treatment atmosphere by a moving mechanism having a cooling unit while cooling the substrate to a temperature lower than the temperature at which the coating solution oxidizes.

* * * * *